US010345835B2

(12) United States Patent
Wang

(10) Patent No.: US 10,345,835 B2
(45) Date of Patent: Jul. 9, 2019

(54) VOLTAGE GENERATION APPARATUS AND SEMICONDUCTOR CHIP

(71) Applicant: Huawei Technologies Co., Ltd., Shenzhen, Guangdong (CN)

(72) Inventor: Xinru Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/226,421

(22) Filed: Dec. 19, 2018

(65) Prior Publication Data

US 2019/0121380 A1    Apr. 25, 2019

Related U.S. Application Data

(63) Continuation of application No. PCT/CN2017/078420, filed on Mar. 28, 2017.

(30) Foreign Application Priority Data

Aug. 18, 2016    (CN) .......................... 2016 1 0685888

(51) Int. Cl.
  *G05F 1/56*    (2006.01)
  *H02M 3/158*    (2006.01)
  (Continued)

(52) U.S. Cl.
  CPC ............ *G05F 1/565* (2013.01); *H02M 3/158* (2013.01); *H02M 3/335* (2013.01); *H03M 1/0678* (2013.01)

(58) Field of Classification Search
  CPC ........................ G05F 1/565; H03M 1/0678
  See application file for complete search history.

(56) References Cited

U.S. PATENT DOCUMENTS 5,219,228 A * 6/1993 Ker ..................... F02D 41/1446
                                                                    324/713
5,856,756 A * 1/1999 Sasahara ................. G05F 1/465
                                                                    327/205

(Continued)

FOREIGN PATENT DOCUMENTS

CN          1643764 A      7/2005
CN        101322088 A    12/2008
(Continued)

OTHER PUBLICATIONS

Minki Cho, et al., "Postsilicon Voltage Guard-Band Reduction in a 22 nm Graphics Execution Core Using Adaptive Voltage Scaling and Dynamic Power Gating," IEEE Journal of Solid-State Circuits, vol. 52, No. 1, Jan. 2017, 14 pages.

*Primary Examiner* — Yusef A Ahmed

(57) ABSTRACT

A voltage generation apparatus includes: a controller, a first voltage division controller, a second voltage division controller, and a voltage detector. The first voltage division controller and a load are connected in series between an input power supply and ground. The second voltage division controller and the load are connected in parallel between ground and a connection point between the first voltage division controller and the load. The voltage detector is electrically connected to the load, and is configured to: detect a load voltage of the load, and feed back a detected value of the load voltage to the controller. The controller is configured to: receive the detected value fed back by the voltage detector, and generate a control signal based on the detected value. The control signal is used to control the first voltage division controller and the second voltage division controller.

20 Claims, 5 Drawing Sheets

(51) Int. Cl.
*G05F 1/565* (2006.01)
*H02M 3/335* (2006.01)
*H03M 1/06* (2006.01)

(56) References Cited

U.S. PATENT DOCUMENTS

| | | | | |
|---|---|---|---|---|
| 5,953,218 | A * | 9/1999 | Mukaibara | H02M 3/33507 363/21.09 |
| 5,966,004 | A * | 10/1999 | Kadanka | G05F 1/618 323/224 |
| 6,130,525 | A * | 10/2000 | Jung | G05F 1/575 323/268 |
| 6,259,237 | B1 | 7/2001 | Fischer | |
| 6,713,991 | B1 * | 3/2004 | McCallum | G05F 1/613 323/226 |
| 6,937,180 | B1 | 8/2005 | Muratov et al. | |
| 9,584,033 | B1 * | 2/2017 | Huang | H02M 3/33546 |
| 2002/0024389 | A1 * | 2/2002 | Nishiyama | H02M 3/155 330/297 |
| 2003/0174528 | A1 | 9/2003 | Wong et al. | |
| 2004/0032242 | A1 * | 2/2004 | Corva | H02M 3/156 323/284 |
| 2005/0002134 | A1 * | 1/2005 | Ohtake | H02M 3/156 361/18 |
| 2005/0023995 | A1 * | 2/2005 | Ohnishi | H05B 41/3921 315/291 |
| 2007/0200536 | A1 * | 8/2007 | Riccio | G05F 1/613 323/224 |
| 2007/0262760 | A1 * | 11/2007 | Liu | H02M 3/1588 323/282 |
| 2009/0295462 | A1 | 12/2009 | Itoh | |
| 2011/0215781 | A1 * | 9/2011 | Sasaki | G05F 1/10 323/283 |
| 2011/0227635 | A1 | 9/2011 | Hashimoto et al. | |
| 2012/0155168 | A1 * | 6/2012 | Kim | G11C 5/14 365/185.03 |
| 2012/0212201 | A1 * | 8/2012 | Lee | H02M 3/073 323/282 |
| 2012/0229116 | A1 * | 9/2012 | Namai | G05F 1/56 323/311 |
| 2013/0063154 | A1 * | 3/2013 | Nakajima | B60L 3/0046 324/550 |
| 2013/0193874 | A1 * | 8/2013 | Takahashi | G05F 1/468 315/297 |
| 2014/0176096 | A1 * | 6/2014 | Yamamoto | H02M 3/158 323/271 |
| 2016/0276965 | A1 * | 9/2016 | Kaidu | H02P 6/182 |
| 2017/0358989 | A1 * | 12/2017 | Werner | H02M 1/08 |
| 2018/0188762 | A1 * | 7/2018 | Wang | G05F 1/46 |

FOREIGN PATENT DOCUMENTS

| | | |
|---|---|---|
| CN | 101644937 A | 2/2010 |
| CN | 201533275 U | 7/2010 |
| CN | 102193570 A | 9/2011 |
| CN | 103869852 A | 6/2014 |
| CN | 203798884 U | 8/2014 |
| CN | 104238609 A | 12/2014 |
| CN | 105449643 A | 3/2016 |
| CN | 106292827 A | 1/2017 |
| EP | 0665530 A1 | 8/1995 |
| JP | S544528 A | 1/1979 |
| WO | 0036739 A1 | 6/2000 |

* cited by examiner

VOLTAGE GENERATION APPARATUS AND SEMICONDUCTOR CHIP

CROSS-REFERENCE TO RELATED APPLICATIONS

This application is a continuation of International Application No. PCT/CN2017/078420, filed on Mar. 28, 2017, which claims priority to Chinese Patent Application No. 201610685888.6, filed on Aug. 18, 2016. The disclosures of the aforementioned applications are hereby incorporated by reference in their entireties.

TECHNICAL FIELD

The present application relates to the field of circuit technologies, and in particular, to a voltage generation apparatus and a semiconductor chip.

BACKGROUND

In a broad sense, a power supply includes a power source and a power circuit. Common power circuits include various regulated power supplies, uninterrupted power supplies, and the like. These power circuits need to process a voltage provided by a power source, to obtain a voltage that is required by an electrical appliance (that is, a load). The processed voltage is stable. Therefore, the power circuit in the power supply is a very important part. To operate normally, the electrical appliance (that is, a load) needs a desirable power circuit.

Due to an actual application requirement, a voltage power supply requirement for a load extends to more voltage domains from two cases including a single operating voltage and a voltage that is lower than a threshold. That is, a common chip power supply technology relates to supply of power for a normal operating voltage of the load or for a voltage lower than a threshold. However, as a semiconductor process advances, performance of a chip under different supply voltages may switch between different states, so as to meet requirements in different application scenarios and different operating modes. In addition, because the load is affected by various factors such as process variation, a temperature impact, and a power fluctuation, a supply voltage of the load needs to change in real time.

However, in the prior art, an on-chip power supply has some disadvantages in design. For example, a specified module needs to be aimed from the beginning of the design, that is, a status of a load current needs to be evaluated in advance and a specific value range of an adjustable resistor needs to be provided. However, if the load current is inaccurately estimated or the load varies greatly in different scenarios, an output voltage range is risky. As shown in FIG. 1, FIG. 1 is a schematic diagram of a basic principle of a linear on-chip power supply in the prior art according to an embodiment in the present disclosure. In the linear on-chip power supply, stability of an output voltage Vout is maintained by adjusting an R1do resistor. In a circuit corresponding to FIG. 1, it can be learned that a proportional relationship needs to be maintained between the R1do and an Rload to obtain an expected output voltage Vout. Therefore, in this implementation solution, practicability and flexibility of the power supply cannot be met.

SUMMARY

Embodiments of the present disclosure provide a voltage generation apparatus and a semiconductor chip, so as to provide a good output voltage range when a load changes greatly.

According to a first aspect, an embodiment of the present disclosure provides a voltage generation apparatus, including: a controller, a first voltage division controller, a second voltage division controller, and a voltage detector, where the first voltage division controller and a load are connected in series between an input power supply and ground; the second voltage division controller and the load are connected in parallel between ground and a connection point between the first voltage division controller and the load; the voltage detector is electrically connected to the load, and is configured to: detect a load voltage of the load, and feed back a detected value of the load voltage to the controller; and the controller is electrically connected to the voltage detector, the first voltage division controller, and the second voltage division controller, and is configured to: receive the detected value fed back by the voltage detector, and generate a control signal based on the detected value, where the control signal is used to control the first voltage division controller and the second voltage division controller to adjust the load voltage to a target value, where when the detected value is greater than the target value, the control signal is used to execute at least one type of the following control: controlling a resistance of the first voltage division controller to increase, or controlling a resistance of the second voltage division controller to decrease; or when the detected value is less than the target value, the control signal is used to execute at least one type of the following control: controlling a resistance of the first voltage division controller to decrease, or controlling a resistance of the second voltage division controller to increase.

With reference to the first aspect, in a first possible implementation, the first voltage division controller or the second voltage division controller includes multiple switch-controlled resistor sets, the multiple switch-controlled resistor sets are connected in parallel, each switch-controlled resistor set includes at least one parallel switch-controlled resistor, a primary switch-controlled resistor is controlled by a control bit in the control signal to control connection or disconnection of the switch-controlled resistor set, and multiple parallel control bits of the control signal are separately used to control connection or disconnection of the multiple switch-controlled resistor sets.

With reference to the first possible implementation of the first aspect, in a second possible implementation, when the control bit controls the switch to be on, the switch-controlled resistor set is connected, and the resistor of the first voltage division controller or that of the second voltage division controller is controlled to decrease; or when the control bit controls the switch to be off, the switch-controlled resistor set is disconnected, and the resistor of the first voltage division controller or that of the second voltage division controller is controlled to increase.

With reference to the first possible implementation of the first aspect, or with reference to the second possible implementation of the first aspect, in a third possible implementation, the switch-controlled resistor is a power gating cell PGCell.

With reference to the third possible implementation of the first aspect, in a fourth possible implementation, a switch of a PGCell in the first voltage division controller and a switch of a PGCell in the second voltage division controller are different types of transistors; and a control bit in the control signal received by the switch of the PGCell in the first voltage division controller and a control bit in the control signal received by the switch of the PGCell in the second voltage division controller have a same signal phase.

With reference to the fourth possible implementation of the first aspect, in a fifth possible implementation, the control bit in the control signal received by the switch of the PGCell in the first voltage division controller and the control bit in the control signal received by the switch of the PGCell in the second voltage division controller are a same control bit.

With reference to the fourth possible implementation of the first aspect, or with reference to the fifth possible implementation of the first aspect, in a sixth possible implementation, the different types of transistors are separately a P-channel metal-oxide semiconductor PMOS transistor and an N-channel metal-oxide semiconductor NMOS transistor.

With reference to the third possible implementation of the first aspect, in a seventh possible implementation, a switch of a PGCell in the first voltage division controller and a switch of a PGCell in the second voltage division controller are a same type of transistor; and a control bit in the control signal received by the switch of the PGCell in the first voltage division controller and a control bit in the control signal received by the switch of the PGCell in the second voltage division controller have opposite signal phases.

With reference to the seventh possible implementation of the first aspect, in an eighth possible implementation, the same type of transistor is a PMOS transistor or an NMOS transistor.

With reference to the first possible implementation of the first aspect, or with reference to the second possible implementation of the first aspect, or with reference to the third possible implementation of the first aspect, or with reference to the fourth possible implementation of the first aspect, or with reference to the fifth possible implementation of the first aspect, or with reference to the sixth possible implementation of the first aspect, or with reference to the seventh possible implementation of the first aspect, or with reference to the eighth possible implementation of the first aspect, in a ninth possible implementation, the at least one switch-controlled resistor set includes N parallel switch-controlled resistors, each switch-controlled resistor includes a resistor and the switch that are connected in series, and N is a positive integer greater than or equal to 2, where in the N switch-controlled resistors, a control terminal of a switch of a primary switch-controlled resistor is configured to receive a control bit corresponding to the at least one switch-controlled resistor set; and in the N switch-controlled resistors, a control terminal of a switch of a current switch-controlled resistor is coupled to a connection point between a switch and a resistor that are connected in series in a previous switch-controlled resistor, and receives a signal output by the connection point.

With reference to the first possible implementation of the first aspect, or with reference to the second possible implementation of the first aspect, or with reference to the third possible implementation of the first aspect, or with reference to the fourth possible implementation of the first aspect, or with reference to the fifth possible implementation of the first aspect, or with reference to the sixth possible implementation of the first aspect, or with reference to the seventh possible implementation of the first aspect, or with reference to the eighth possible implementation of the first aspect, in a tenth possible implementation, the at least one switch-controlled resistor set includes N parallel switch-controlled resistor pairs, each switch-controlled resistor pair includes a pair of parallel switch-controlled resistors, each switch-controlled resistor includes a resistor and the switch that are connected in series, and N is a positive integer greater than or equal to 2, where in the N switch-controlled resistor pairs, a control terminal of a switch of a primary switch-controlled resistor in a primary switch-controlled resistor pair is configured to receive a control bit corresponding to the at least one switch-controlled resistor set; in the N switch-controlled resistor pairs, a control terminal of a switch of a primary switch-controlled resistor in a current switch-controlled resistor pair is coupled to a connection point between a switch and a resistor that are connected in series in a primary switch-controlled resistor in a previous switch-controlled resistor pair, and receives a signal output by the connection point; in the N switch-controlled resistor pairs, a control terminal of a switch of the other switch-controlled resistor in the last switch-controlled resistor pair is coupled to a connection point between a switch and a resistor that are connected in series in a primary switch-controlled resistor in the last switch-controlled resistor pair, and receives a signal output by the connection point; and in the N switch-controlled resistor pairs, a control terminal of a switch of the other switch-controlled resistor in the previous switch-controlled resistor pair is coupled to a connection point between a switch and a resistor that are connected in series in the other switch-controlled resistor in the current switch-controlled resistor pair, and receives a signal output by the connection point.

With reference to the tenth possible implementation of the first aspect, in an eleventh possible implementation, in any switch-controlled resistor pair, a resistance of the resistor in the primary switch-controlled resistor is greater than a resistance of the resistor in the other switch-controlled resistor.

With reference to the first possible implementation of the first aspect, or with reference to the second possible implementation of the first aspect, or with reference to the third possible implementation of the first aspect, or with reference to the fourth possible implementation of the first aspect, or with reference to the fifth possible implementation of the first aspect, or with reference to the sixth possible implementation of the first aspect, or with reference to the seventh possible implementation of the first aspect, or with reference to the eighth possible implementation of the first aspect, or with reference to the ninth possible implementation of the first aspect, or with reference to the tenth possible implementation of the first aspect, or with reference to the eleventh possible implementation of the first aspect, in a twelfth possible implementation, when the detected value is greater than the target value, at least one control bit of multiple parallel control bits of the control signal is used to: control at least one switch-controlled resistor set that is in the first voltage division controller and that corresponds to the at least one control bit, to change from disconnection to connection; or when the detected value is less than the target value, at least one control bit of multiple parallel control bits of the control signal is used to: control at least one switch-controlled resistor set that is in the first voltage division controller and that corresponds to the at least one control bit, to change connection to disconnection.

With reference to the first possible implementation of the first aspect, or with reference to the second possible implementation of the first aspect, or with reference to the third possible implementation of the first aspect, or with reference to the fourth possible implementation of the first aspect, or with reference to the fifth possible implementation of the first aspect, or with reference to the sixth possible implementation of the first aspect, or with reference to the seventh possible implementation of the first aspect, or with reference to the eighth possible implementation of the first aspect, or with reference to the ninth possible implementation of the first aspect, or with reference to the tenth possible implementation of the first aspect, or with reference to the eleventh possible implementation of the first aspect, or with reference to the twelfth possible implementation of the first aspect, in a thirteenth possible implementation, when the detected value is greater than the target value, at least one control bit of multiple parallel control bits of the control signal is used to: control at least one switch-controlled resistor set that is in the second voltage division controller and that corresponds to the at least one control bit, to change connection to disconnection; or when the detected value is less than the target value, at least one control bit of multiple parallel control bits of the control signal is used to: control at least one switch-controlled resistor set that is in the second voltage division controller and that corresponds to the at least one control bit, to change from disconnection to connection.

With reference to the first aspect, or with reference to the first possible implementation of the first aspect, or with reference to the second possible implementation of the first aspect, or with reference to the third possible implementation of the first aspect, or with reference to the fourth possible implementation of the first aspect, or with reference to the fifth possible implementation of the first aspect, or with reference to the sixth possible implementation of the first aspect, or with reference to the seventh possible implementation of the first aspect, or with reference to the eighth possible implementation of the first aspect, or with reference to the ninth possible implementation of the first aspect, or with reference to the tenth possible implementation of the first aspect, or with reference to the eleventh possible implementation of the first aspect, or with reference to the twelfth possible implementation of the first aspect, or with reference to the thirteenth possible implementation of the first aspect, in a fourteenth possible implementation, the voltage detector includes a voltage information feedback unit, a voltage sampling and feedback unit, and a voltage encoding and feedback unit, where the voltage information feedback unit is configured to: read an analog load voltage of the load, and convert the voltage to a digital signal; the voltage sampling and feedback unit is configured to perform sampling on the digital signal based on a clock cycle, to obtain a voltage sampling signal; and the voltage encoding and feedback unit is configured to encode the voltage sampling signal, to obtain the detected value of the load voltage.

With reference to the fourteenth possible implementation of the first aspect, in a fifteenth possible implementation, the detected value is a binary serial number.

According to a second aspect, an embodiment of the present disclosure provides a semiconductor chip, including a voltage generation apparatus and a load, where the voltage generation apparatus includes the voltage generation apparatus according to any implementation provided in the first aspect; and the load operates under an action of the load voltage, and the load is any one of a logic circuit, a functional circuit, a memory, or a processor.

Implementation of the embodiments of the present disclosure has the following beneficial effects:

According to the embodiments of the present disclosure, the voltage generation apparatus is provided, and the load voltage is adjusted by properly controlling the first voltage division controller and the second voltage division controller in the voltage generation apparatus, to reach the target value. In this way, a good output voltage range can be provided when the load or a load current changes greatly, and practicability is enhanced and extended.

BRIEF DESCRIPTION OF DRAWINGS

To describe the technical solutions in the embodiments of the present disclosure or in the prior art more clearly, the following briefly describes the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

Figure 1:
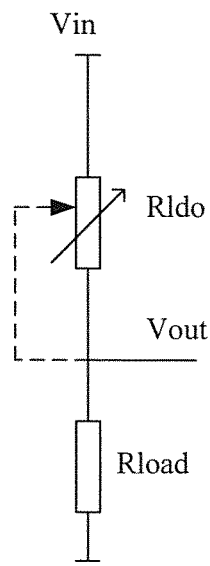
FIG. 1 is a schematic diagram of a basic principle of a linear on-chip power supply in the prior art according to an embodiment in the present disclosure.

To make a person skilled in the art understand the technical solutions in the present disclosure better, the following clearly describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

The following provides detailed descriptions separately.

In the specification, claims, and accompanying drawings of the present disclosure, the terms "first", "second", "third", "fourth", and so on are intended to distinguish between different objects but do not indicate a particular order. In addition, the terms "including", "having", or any other variant thereof, are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

The "embodiment" mentioned in this specification means that a specific characteristic, structure, or feature described with reference to the embodiment may be included in at least one embodiment of the present disclosure. This term appears in different positions of this specification. It does not necessarily mean that this term all indicates a same embodiment. This term does not indicate an independent or alternative embodiment that is mutually exclusive from another embodiment. A person skilled in the art explicitly and implicitly understands that the embodiment described in this specification may be combined with another embodiment.

For ease of understanding by a person skilled in the art, the following explains and describes some terms in this application.

(1) Power gating: A switch using a power gating technology is mostly implemented by using a multi-threshold complementary metal-oxide semiconductor (MTCMOS, Multi-Threshold CMOS), to reduce static power consumption of the switch. When a load operates, power gating is disabled, and an operating voltage of the load is a voltage required by the load. When a load does not operate, power gating is enabled, so that a power supply of the load is lower than a normal voltage. When a load is applied differently, for example, when the load is a memory, power gating is enabled, and a supply voltage of the load may be modulated to a voltage value required by the load (for example, a minimum voltage value that ensures that memory data is not lost). In the prior art, a power gating cell (PGcell) is a unit for executing power gating by a low-consumption means, and is a standard unit for digital design. The power gating cell can implement control on power supply connection.

(2) Die: A die is a chip that has a complete function and that is cut from a wafer. Generally, the die is approximately several millimeters in size. A pad or a hole used for connecting a metallic wire (wire bonding) is on an edge. The metallic wire is connected to an external pin or a pad on a circuit board.

(3) Coupling: Coupling in an electronic circuit generally means sending a signal from a previous stage to a current stage. Specifically, coupling is a scenario in which two or more circuit components, or input and output of an electronic network closely cooperate with each other and affect each other, and energy is transmitted from one side to the other side by using interaction. A coupled circuit is a circuit that participates in a coupling process. For example, two stages of circuits have different direct current levels, and therefore capacitive coupling is required; input impedance does not match output impedance, and therefore a circuit with matching impedance is required. In conclusion, to implement energy and signal transmission, a method for connecting all functional circuits is circuit coupling. Generally, a coupled circuit usually has one or more functions of filtering, power storage, isolation, impedance transformation, or the like.

(4) "Multiple" means two or more. "And/or" describes an association relationship between associated objects, and represents that three relationships may exist. For example, A and/or B may represent the following three cases: Only A exists, both A and B exist, and only B exists. A symbol "/" usually indicates an "or" relationship between the associated objects.

Figure 2:
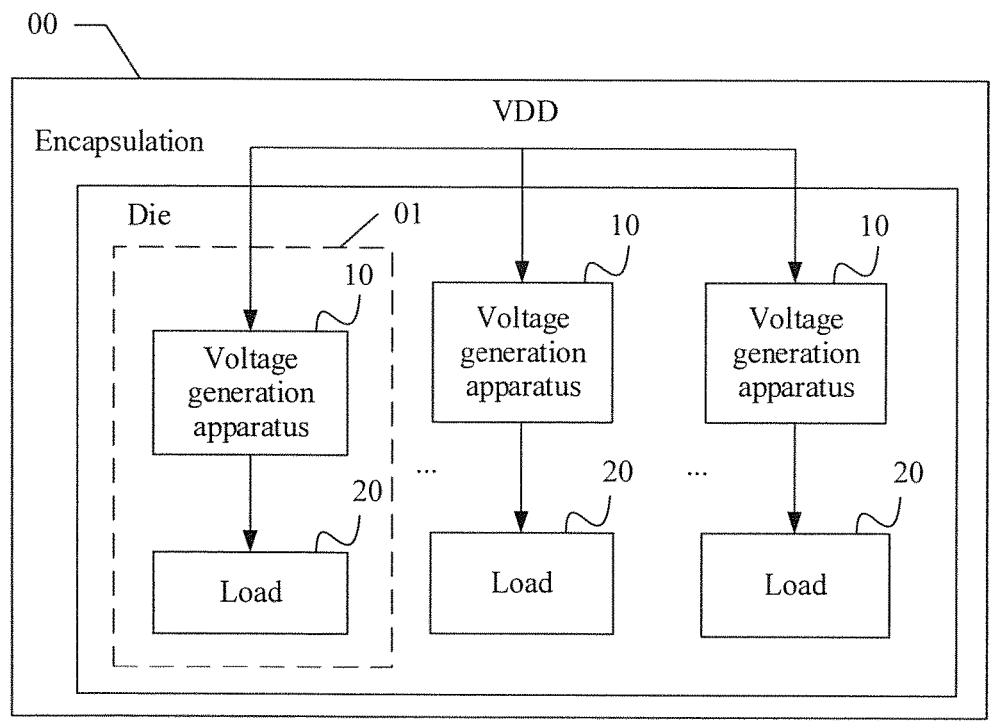
FIG. 2 is a schematic structural diagram of a chip of a voltage generation apparatus according to an embodiment of the present disclosure.

Referring to FIG. 2, FIG. 2 is a schematic structural diagram of a chip of an on-chip integrated voltage generation apparatus according to an embodiment of the present disclosure. In the chip 00 in FIG. 2, multiple voltage generation apparatuses 10 and multiple loads 20 are integrated into a die, and then are uniformly encapsulated. In FIG. 2, an input power supply VDD (for example, a battery) drives or supplies power to the chip 00, and the voltage generation apparatus 10 on the chip 00 generates a stable voltage with the power supplied by the VDD or as driven by the VDD, to supply power to the load 20 (for example, a logic circuit, a function module, a memory, or a processor) that is on the chip 00 and that is electrically connected to the chip 00. When the load 20 is a function module, the load 20 may perform various types of signal processing, for example, a module or a unit for processing a communications protocol, processing a voice conversion, processing a photographed image, or the like. It may be understood that the chip 00 shown in FIG. 2 may be used as some or all of various electronic apparatuses. This is not specifically limited in this embodiment of the present disclosure. The following describes in detail a specific structure and function of a power supply unit 01 that includes the voltage generation apparatus 10 on the chip 00 shown in FIG. 2 and the load 20 to which the voltage generation apparatus 10 supplies power.

Figure 3:
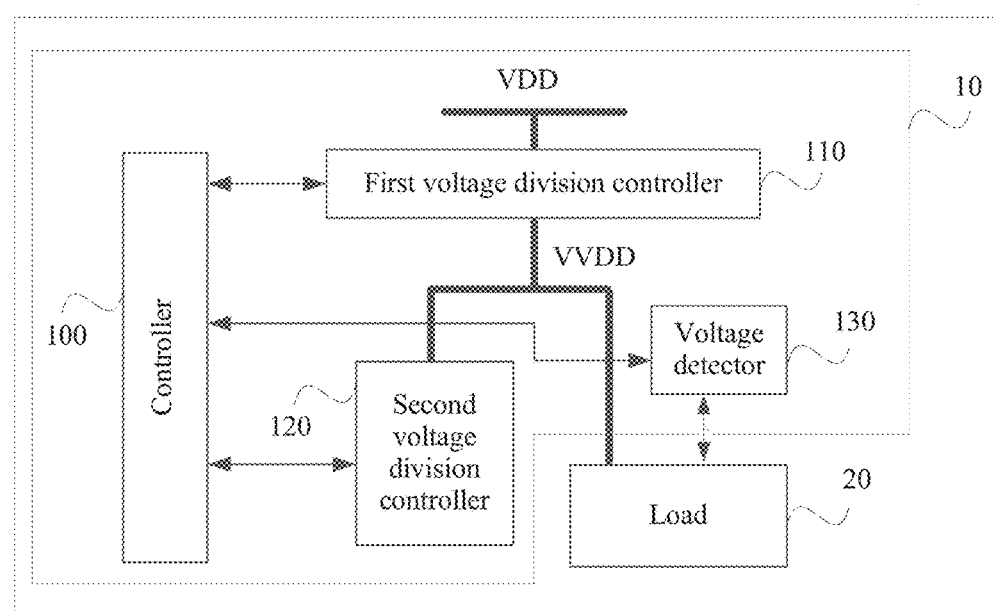
FIG. 3 is a schematic structural diagram of a power supply unit according to an embodiment of the present disclosure.

Referring to FIG. 3, FIG. 3 is a schematic structural diagram of a power supply unit according to an embodiment of the present disclosure. The power supply unit 01 includes a voltage generation apparatus 10 and a load 20 to which the voltage generation apparatus 10 supplies power. The voltage generation apparatus 10 may include: a controller 100, a first voltage division controller 110, a second voltage division controller 120, and a voltage detector 130. Specifically, the first voltage division controller 110 and the load 20 are connected in series between an input power supply VDD and ground. The second voltage division controller 120 and the load 20 are connected in parallel between ground and a connection point VVDD between the first voltage division controller 110 and the load 20. It can be learned that a voltage of the connection point VVDD reflects a load voltage. The voltage detector 130 is electrically connected to the load 20, and is configured to: detect a load voltage of the load 20 in real time, and feed back a detected value of the load voltage to the controller 100. The controller 100 is electrically connected to the voltage detector 130, the first voltage division controller 110, and the second voltage division controller 120, and is configured to: receive the detected value fed back by the voltage detector 130, and generate a control signal based on the detected value. The control signal is used to control the first voltage division controller 110 and the second voltage division controller 120 to adjust the load voltage to a target value. A control rule may mainly conform to the following principle: when the detected value is greater than the target value, the control signal is used to execute at least one type of the following control: controlling a resistance of the first voltage division controller to increase, or controlling a resistance of the second voltage division controller to decrease; or when the detected value is less than the target value, the control signal is used to execute at least one type of the following control: controlling a resistance of the first voltage division controller to decrease, or controlling a resistance of the second voltage division controller to increase.

Figure 4:
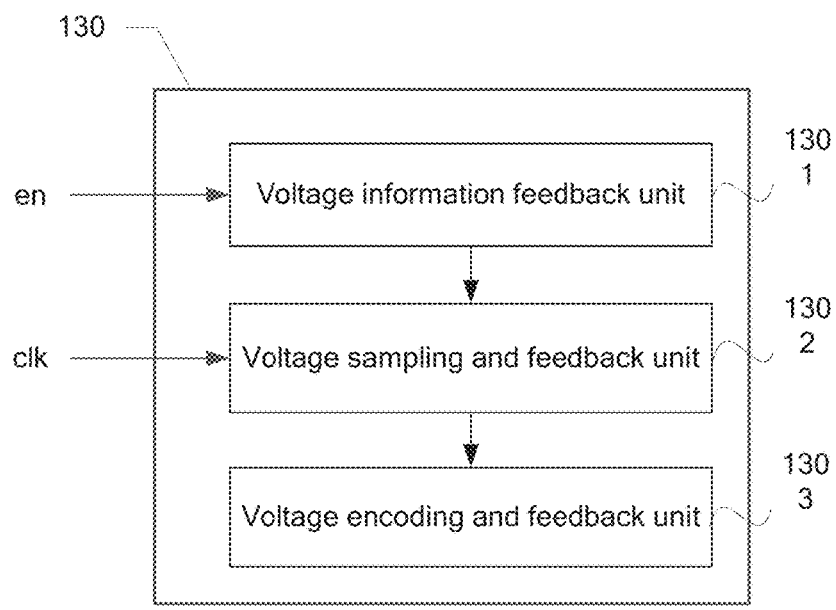
FIG. 4 is a schematic structural diagram of a voltage detector according to an embodiment of the present disclosure.

As shown in FIG. 4, FIG. 4 is a schematic structural diagram of a voltage detector according to an embodiment of the present disclosure. The voltage detector 130 is mainly responsible for detecting, in real time, a load voltage of a load 20 located on a chip, so as to effectively feed back a detected value of the load voltage to a controller 100. Therefore, in a possible implementation, the voltage detector 130 may include a voltage information feedback unit 1301, a voltage sampling and feedback unit 1302, and a voltage encoding and feedback unit 1303. The voltage information feedback unit 1301 is configured to: when an input terminal en terminal is enabled to access an enabling signal, read an original analog load voltage of the load, and convert the voltage to a digital signal. The voltage sampling and feedback unit 1302 is configured to: receive a clock clk signal, and perform, based on a clock cycle of the clock clk, sampling on the digital signal obtained after the conversion performed by the voltage information feedback unit 1301, to obtain a voltage sampling signal. The voltage encoding and feedback unit 1303 is configured to encode the voltage sampling signal that is fed back by the voltage sampling and feedback unit 1302, to obtain the detected value of the load voltage. Finally, the voltage detector 130 feeds back the detected value to the controller 100, so that the controller 100 receives the detected value fed back by the voltage detector 130, and generate a control signal based on the detected value. The control signal is used to control a first voltage division controller 110 and a second voltage division controller 120 to adjust the load voltage to a target value. Further, the detected value may be a binary serial value. In brief, the voltage information feedback unit 1301 converts an analog voltage into a digital signal. The voltage sampling and feedback unit 1302 performs voltage sampling. A clock cycle of the sampling is greater than a clock cycle of outputting a digital signal by the voltage information feedback unit 1301. Therefore, a digital signal that changes more slowly than the original digital signal is obtained after the sampling. The voltage encoding and feedback unit 1303 is a format conversion unit, and is configured to convert, into a digital signal (that is, the detected value) that can be identified by the controller 100, the digital signal that is obtained after the sampling and that reflects the analog voltage. That is, the voltage encoding and feedback unit 1303 is equivalent to an encoder or a format converter. It may be understood that, in this embodiment of the present disclosure, when multiple loads 20 exist, corresponding voltage detectors 130 may be set for different loads 20 according to a requirement so as to cover various application scenarios, for example, a scenario in which a voltage of each on-chip function module that consumes power is maintained stable.

Figure 5A:
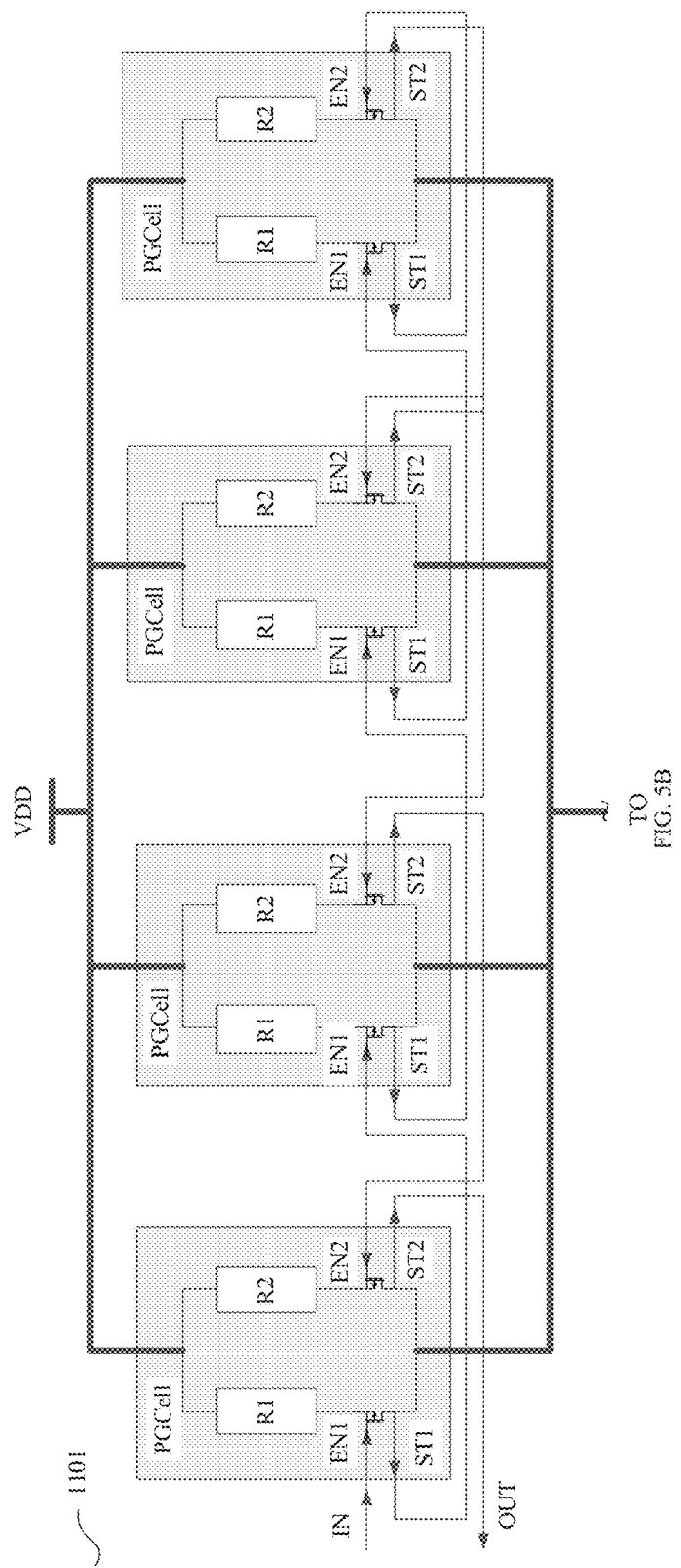
FIG. 5A and FIG. 5B are a schematic structural diagram of an embodiment of a voltage generation apparatus according to an embodiment of the present disclosure.
Figure 5B:
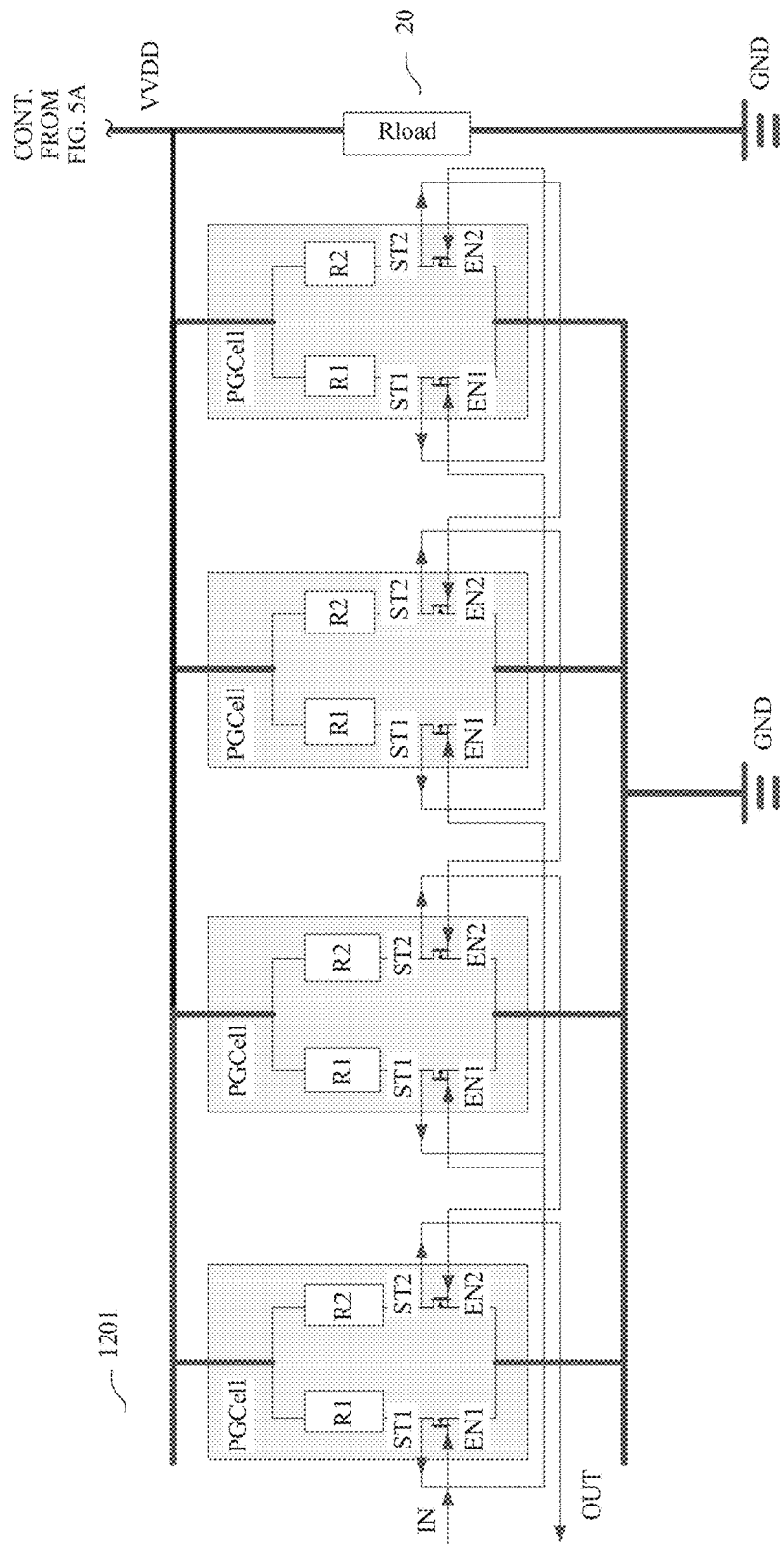

Referring to FIGS. 5A and 5B, there is shown a schematic structural diagram of an embodiment of a voltage generation apparatus according to an embodiment of the present disclosure. The following describes in detail specific implementations of a first voltage division controller 110 and a second voltage division controller 120 of the voltage generation apparatus 10 in the present disclosure with reference to FIG. 3 and FIGS. 5A and 5B. The first voltage division controller 110 and the second voltage division controller 120 of the voltage generation apparatus 10 are used as voltage regulation units in the voltage generation apparatus 10 in the embodiment corresponding to FIG. 3, and may each include a switch-controlled resistor. Therefore, in a possible implementation, the first voltage division controller 110 or the second voltage division controller 120 may include multiple switch-controlled resistor sets (FIGS. 5A and 5B shows a schematic diagram in which a switch-controlled resistor set 1101 or 1201 is used as an example, that is, 1101 and 1201 respectively belong to a part or all of 110 and 120), and the multiple switch-controlled resistor sets are connected in parallel. Specifically, each switch-controlled resistor set includes at least one parallel switch-controlled resistor. A primary switch-controlled resistor (for example, may be R1 of ① in 1101) is controlled by a control bit in the control signal (generated by the controller 100 in FIG. 3), to control connection or disconnection of the switch-controlled resistor set (including ①, ②, ③, and ④ in 1101 shown in FIG. 5A). Multiple parallel control bits (when there are multiple 1101s, INs of the multiple 1101s are multiple parallel control bits) of the control signal are separately used to control connection or disconnection of the multiple switch-controlled resistor sets. It may be understood that an implementation principle of the second voltage division controller 120 is the same as that of the first voltage division controller 110. Details are not described herein again.

Further, when the control bit IN controls the switch to be on, a resistance of the switch-controlled resistor set in the first voltage division controller 110 or a resistance of the switch-controlled resistor set in the second voltage division controller 120 in FIG. 3 decreases. That is, when the control bit IN controls the switch to be on, a resistor in the first voltage division controller changes from a disconnected state (in the disconnected state, the resistance is considered as infinite) to a connected state (a resistance in the connected state is a value of multiple sets of parallel R1 and R2), and therefore the resistance decreases. When the control bit IN controls the switch to be off, the switch-controlled resistor set is disabled, and a resistance of the first voltage division controller or that of the second voltage division controller is controlled to increase, that is, when the control bit IN controls the switch to be off, a resistor in the first voltage division controller changes from a connected state (a resistance in the connected state is a value of multiple groups of parallel R1 and R2) to a disconnected state (in the disconnected state, the resistance is considered as infinite), and therefore the resistance increases. OUT output in the circuit corresponding to FIGS. 5A and 5B reflects a current connected state of the voltage division controller (a switch-controlled resistor set), and an output control signal in the OUT may be directly fed back to the controller 100 in the embodiment corresponding to FIG. 3, and is used to indicate a quantity of currently connected switch-controlled resistor sets in the first voltage division controller of the controller 100, that is, indicate whether a resistor set normally operates. In this way, the controller 100 performs corresponding control according to feedback from the voltage detector 130 and according to a specific quantity of connected switch-controlled resistor sets in the first voltage division controller 110 and the second voltage division controller 120 or an operating state of switch-controlled resistor sets in the first voltage division controller 110 and the second voltage division controller 120. It should be understood that when EN1 is effective (a high level), EN2 is also effective (a high level). That is, IN and OUT have a same phase. However, EN1 and EN2 are one after another in validity, that is, EN2 follows EN1.

Figure 6:
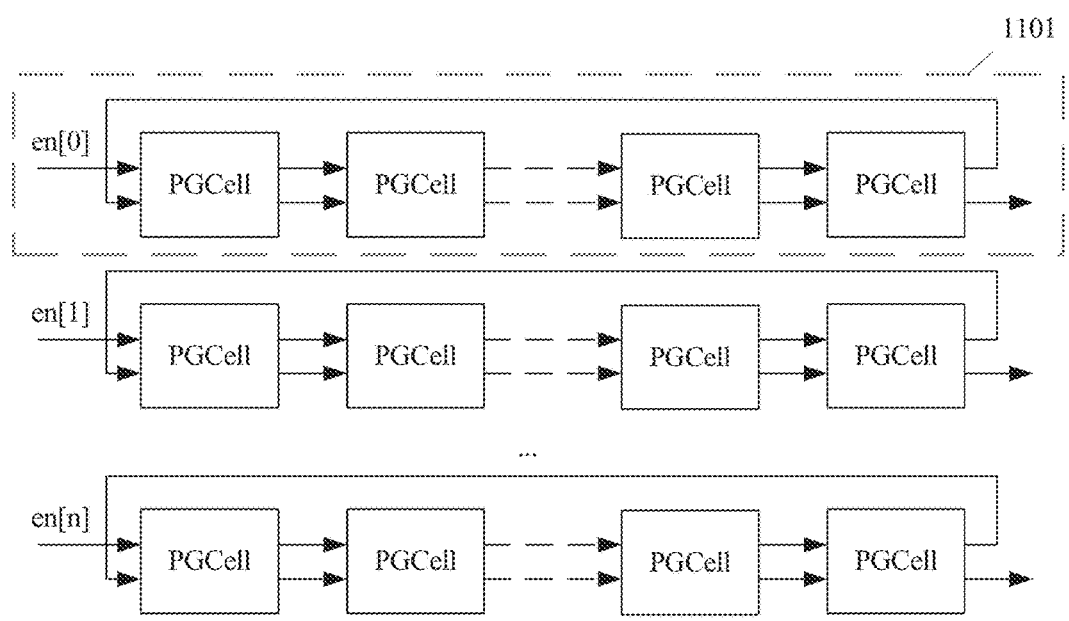
FIG. 6 is a schematic structural diagram of multiple parallel PGCell sets according to an embodiment of the present disclosure.

Further, if a switch-controlled resistor is a power gating cell PGCell, switch-controlled resistors in the first voltage division controller 110 and those in the second voltage division controller 120 in FIG. 3 and FIGS. 5A and 5B are all PGCells, that is, the first voltage division controller 110 or the second voltage division controller 120 may include multiple power gating cell PGCell sets. Referring to FIG. 6, FIG. 6 is a schematic structural diagram of multiple parallel PGCell sets according to an embodiment of the present disclosure. The multiple parallel PGCell sets in FIG. 6 are equivalent to a first voltage division controller 110 or a second voltage division controller 120. Each PGCell set (shown in a dashed-line box in FIG. 6) is equivalent to 1101 or 1201 in FIG. 5, and includes multiple parallel PGCells. Each PGCell set corresponds to a unique control bit en, for example, en[0] en[1] . . . en[n]. An en signal in this control bit is separately controlled by a corresponding controller 100 (shown in FIG. 3). FIG. 6 shows at least three PGCell sets. The PGCell sets are in a parallel relationship. Each PGCell set includes at least one PGCell. When each PGCell set includes multiple PGCells, the multiple PGCells are connected in parallel. It may be understood that different voltages of a load 20 are obtained due to different quantities of connected PGCell sets. Therefore, when a voltage on the load 20 is unstable, a quantity of connected PGCell sets in the first voltage division controller 110 and/or in the second voltage division controller 120 may be controlled to maintain stability of the voltage on the load 20.

With reference to specific embodiments corresponding to FIG. 3 and FIGS. 5A and 5B, a specific function of the controller 100 in a specific regulation process is described in detail. As a hub of the voltage generation apparatus 10, the controller 100 receives various types of feedback information (including a detected value of a load voltage of a load) from the voltage detector 130, and controls the first voltage division controller 110 and/or the second voltage division controller 120 according to the feedback information, so as to ensure that a supply voltage of the load 20 is stable and reliable. Further, when the controller 100 determines that the detected value is greater than a target value, at least one control bit of multiple parallel control bits in a control signal generate by the controller 100 is used to: control at least one PGCell set that is in the first voltage division controller and that corresponds to at least one control bit, to change from disconnection to connection; or when the controller 100 determines that a detected value is less than a target value, at least one control bit of multiple parallel control bits in a control signal generate by the controller 100 is used to: control at least one PGCell set that is in the first voltage division controller and that corresponds to at least one control bit, to change connection to disconnection. A reason is that: when the controller 100 determines that a voltage on the load 20 is extremely low (less than a preset voltage threshold), a case in which the load 20 cannot normally operate may be caused, and therefore the voltage on the load 20 needs to be improved to the target value. In addition, the first voltage division controller 110 is connected to the load 20 in series, and a resistance of the load 20 is unchanged. Therefore, the voltage on the load 20 can be increased by increasing a current on the load 20. That is, a resistance of the first voltage division controller 110 may be reduced, to reduce a total series resistance of the first voltage division controller 110 and the load 20. Therefore, the current on the load 20 (and the voltage division controller 110) increases, and the voltage on the load 20 further increases. Because the first voltage division controller 110 is multiple parallel PGCell sets, a quantity of connected parallel PGCell sets in the first voltage division controller is increased to reduce the resistance of the first voltage division controller 110, so as to stabilize the voltage on the load 20. And/or, when the detected value is greater than the target value, at least one control bit of multiple parallel control bits of the control signal is used to: control at least one PGCell set that is in the second voltage division controller 120 and that corresponds to the at least one control bit, to change connection to disconnection; or when the detected value is less than the target value, at least one control bit of multiple parallel control bits of the control signal is used to: control at least one PGCell set that is in the second voltage division controller 120 and that corresponds to the at least one control bit, to change from disconnection to connection. For a control principle of the above, refer to description of an adjustment principle about the first voltage division controller 110 in the foregoing embodiments. Details are not provided herein again. It may be understood that, in this embodiment of the present disclosure, in a PGCell set, for example, a quantity of PGCells is not limited, may be one or more, and is determined based on a specific application scenario. When there is one PGCell, the PGCell set is equal to the PGCell.

In conclusion, the voltage generation apparatus provided in the present disclosure not only can resolve a problem of an output voltage range when the load current is inaccurately estimated or is greatly different in different scenarios, but also can effectively suppress a large transient shock by using an on-chip integrated PGCell set, reduce an application risk, and improve quality of an on-chip power supply. Next, the following describes in detail how the voltage generation apparatus provided in the present disclosure effectively suppresses a relatively large transient shock.

Specifically, referring to FIGS. 5A and 5B, there are shown a first voltage division controller 110 (only one PGCell set 1101 is drawn, a structure is similar to a structure used when there are multiple PGCell sets, and the PGCells are connected to each other in parallel), a second voltage division controller 120 (only one PGCell set 1201 is drawn, a structure is similar to a structure used when there are multiple PGCell sets, and the PGCells are connected to each other in parallel), and a load equivalent impedance Rload (that is, a load 20). VDD is an input power supply, and VVDD is a load voltage. The at least one PGCell set includes N (4 is shown in FIGS. 5A and 5B) parallel switch-controlled resistor pairs, each switch-controlled resistor pair includes a pair of parallel switch-controlled resistors (for example, ①, ②, ③, and ④), each switch-controlled resistor includes a resistor and the switch that are connected in series, and N is a positive integer greater than or equal to 2. In the N switch-controlled resistor pairs, a control terminal (EN1 of ① in 1101 in FIG. 5A) of a switch of a primary switch-controlled resistor (for example, R1 of ① in 1101 in FIG. 5A) in a primary switch-controlled resistor pair (for example, ① in 1101 in FIG. 5A) is configured to receive a control bit corresponding to the PGCell set (1101 in FIG. 5A). In the N switch-controlled resistor pairs, a control terminal (for example, EN1 of R1 of ② in 1101 in FIG. 5A) of a switch of a primary switch-controlled resistor (for example, R1 of ② in 1101 in FIG. 5A) in a current switch-controlled resistor pair (for example, ② in 1101 in FIG. 5A) is coupled to a connection point (for example, ST1 of R1 of ① in 1101 in FIG. 5A) between a switch and a resistor that are connected in series in a primary switch-controlled resistor in a previous switch-controlled resistor pair, and receives a signal output by the connection point. In the N switch-controlled resistor pairs, a control terminal (EN2 of R2 of ④ in 1101 in FIG. 5A) of a switch of the other switch-controlled resistor in the last switch-controlled resistor pair is coupled to a connection point (ST1 of R1 of ④ in 1101 in FIG. 5A) between a switch and a resistor that are connected in series in a primary switch-controlled resistor in the last switch-controlled resistor pair, and receives a signal output by the connection point. In the N switch-controlled resistor pairs, a control terminal (for example, EN2 of R2 of ③ in 1101 in FIG. 5A) of a switch of the other switch-controlled resistor in the previous switch-controlled resistor pair is coupled to a connection point (for example, ST2 of R2 of ④ in 1101 in FIG. 5A) between a switch and a resistor that are connected in series in the other switch-controlled resistor in the current switch-controlled resistor pair, and receives a signal output by the connection point.

Although a switch-controlled resistor set (that is, a PGCell set) in FIGS. 5A and 5B includes multiple switch-controlled resistor pairs, in an actual application, each switch-controlled resistor pair may also be replaced with a switch-controlled resistor. For example, at least one switch-controlled resistor set (a PGCell set) in the first voltage division controller 110 or the second voltage division controller 120 of the voltage generation apparatus 10 includes N parallel switch-controlled resistors, each switch-controlled resistor includes a resistor and the switch that are connected in series, and N is a positive integer greater than or equal to 2. In the N switch-controlled resistors, a control terminal of a switch of a primary switch-controlled resistor is configured to receive a control bit corresponding to the at least one switch-controlled resistor set. In the N switch-controlled resistors, a control terminal of a switch of a current switch-controlled resistor is coupled to a connection point between a switch and a resistor that are connected in series in a previous switch-controlled resistor, and receives a signal output by the connection point. In this way, an operating principle is similar to that in FIG. 5. Switch-controlled resistors in a switch-controlled resistor set can be sequentially powered on, to avoid a relatively large transient current shock and to prevent a surge.

Based on the foregoing description about the circuit structure, it may be understood that, in the circuit corresponding to FIGS. 5A and 5B, when EN1 in the first voltage division controller 110 or the second voltage division controller 120 is effective (for example, effective to a high level of a PMOS transistor), multiple PGCells in a PGCell set (1101 or 1201) may be sequentially started (as shown in FIG. 5, R1 of ①  in 1101→R1 of ②→R1 of ③→R1 of ④→R2 of ④→R2 of ③→R2 of ②→R2 of ①). The power-on process is sequential, and therefore a current is not transiently excessively high, and a transient excessive VVDD voltage shock is effectively prevented. When EN2 in the first voltage division controller 110 or the second voltage division controller 120 is effective, it is ensured that power is normally supplied to VVDD. In an actual implementation process, to prevent a power-on surge, both large and small transistors are used. It is assumed that R1 is greater than R2. To suppress a system surge current, R1 and R2 are both extremely small in comparison with Rload. Therefore, multiple PGCell sets are connected in parallel, or multiple PGCells are connected in parallel in a PGCell set, so that VVDD is extremely close to VDD. It should be further noted that, when each PGCell (for example, an MTCMOS) in the first voltage division controller 110 is enabled, a channel resistance is generally tens of ohms, and when no PGCell is enabled, a resistance is generally greater than millions of ohms.

It can be seen from the foregoing description that: when a relatively large transient current occurs after the voltage generation apparatus is powered on, by using a chain implementation structure of PGCells in a PGCell set, a surge can be effectively prevented, quality of on-chip power supply is improved, and both a requirement for flexibility of a load voltage range and a requirement for practicability in various scenarios are met.

It should be further noted that, in all embodiments or possible implementations in the present disclosure, switch-controlled switches in a resistor set (a PGCell set) in the first voltage division controller or the second voltage division controller are different types of transistors, and may be common power switches, transistors using a conventional CMOS process, or multi-threshold voltage CMOSs that are most frequently used in a power gating technology. For example, the switch may include: a positive-channel metal-oxide semiconductor (PMOS) transistor, a negative-channel metal-oxide semiconductor (NMOS) transistor, or a multi-threshold voltage MTCMOS transistor.

In a possible implementation, when a switch of a PGCell in the first voltage division controller and a switch of a PGCell in the second voltage division controller are different types of transistors, for example, respectively a P-channel metal-oxide semiconductor PMOS transistor and an N-channel metal-oxide semiconductor NMOS transistor, a control bit in the control signal received by the switch of the PGCell in the first voltage division controller and a control bit in the control signal received by the switch of the PGCell in the second voltage division controller have a same signal phase. Further, the control bit in the control signal received by the switch of the PGCell in the first voltage division controller and the control bit in the control signal received by the switch of the PGCell in the second voltage division controller are a same control bit. In this way, the switch of the PGCell in the first voltage division controller and the switch of the PGCell in the second voltage division controller are not simultaneously on.

In a possible implementation, when a switch of a PGCell in the first voltage division controller and a switch of a PGCell in the second voltage division controller are a same type of transistor, for example, a PMOS transistor or an NMOS transistor, a control bit in the control signal received by the switch of the PGCell in the first voltage division controller and a control bit in the control signal received by the switch of the PGCell in the second voltage division controller have opposite signal phases. It may be understood that a principle of the PMOS transistor and that of the NMOS transistor are similar, and only polarities controlled by gates are opposite. In this way, the switch of the PGCell in the first voltage division controller and the switch of the PGCell in the second voltage division controller are not simultaneously on.

It should be further noted that a quantity of PGCell sets in the first voltage division controller 110, a quantity of PGCell sets in the second voltage division controller 120, and a quantity of PGCells in the set are determined according to a design requirement. The quantity of PGCells sets in the first voltage division controller 110 may be the same as or different from a quantity of PGCell sets in the second voltage division controller 120, and the quantity of PGCells in a set may be the same as or different from the quantity of PGCells in another set. A voltage resolution and an adjustment range by using which the PGCell performs adjustment may be determined according to a design requirement in different solutions. This is not specifically limited in this embodiment of the present disclosure.

In an actual application scenario, a chip configuration process in the embodiments of the present disclosure may be as follows:

(1) Power on a chip. A PGCell set of the first voltage division controller 110 is in an all connected state, a PGCell set of the second voltage division controller 120 is in an all disconnected state, and an on-chip integrated power load is in normal voltage state.

(2) The controller 100 configures, according to an obtained system test related result (this result is configured in the chip in advance), a register that is in the controller 100 and that is required in operation. The register may store an output result or feedback information corresponding to the voltage information feedback unit, the voltage sampling and feedback unit 1302, and the voltage encoding and feedback unit 1303 in the voltage detector 130 in FIG. 3 and FIG. 4. The output result or the feedback information includes but is not limited to a switch state, a control policy, or the like of the first voltage division controller 110 and the second voltage division controller 120.

(3) A software of a chip configures a startup register of the chip. A system or a function module in the chip starts to operate.

(4) The controller 100 reads a state of the voltage detector 130 in real time according to an optional software configuration, to obtain voltage information of the load 20, and adjusts a switch state of a PGCell set of the first voltage division controller 110 and the second voltage division controller 120 in real time according to a control policy. The policy is as follows.

(5) When the controller 100 learns from the voltage detector 130 that a large voltage drop (a measured voltage is less than a normal voltage threshold or a preset value) occurs, the controller 100 may disconnect, according to a configured control policy, some or even all of PGCell sets in the second voltage division controller 120, and connect some or even all of PGCell sets in the first voltage division controller 110, so as to ensure voltage security of the load 20.

(6) When the controller 100 learns from the voltage detector 130 that a large voltage rise (a measured voltage is greater than a normal voltage threshold or a preset value) occurs, the controller 100 may connect, according to a configured control policy, some or even all of PGCell sets in the second voltage division controller 120, and disconnect some or even all of PGCell sets in the first voltage division controller 110, so as to ensure that a counter electromotive force generated by the load 20 due to an operating state does not cause damage to another part (transfer of a relatively large counter electromotive force to another module causes a time sequence problem due to clock and data path voltage differences, and also causes accelerated aging of a current module).

It should be noted that the connection relationship related in the embodiments, for example, a serial connection or a parallel connection, is an electrical connection. The connection may be a direct connection by using a wire, or may be coupling in another manner according to an electric effect.

In the foregoing embodiments, the description of each embodiment has respective focuses. For a part that is not described in detail in an embodiment, reference may be made to related descriptions in other embodiments. The foregoing embodiments are merely intended for describing the technical solutions of the present disclosure, but not for limiting the present disclosure. Although the present disclosure is described in detail with reference to the foregoing embodiments, a person of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

The present disclosure further provides a semiconductor chip. The chip includes the voltage generation apparatus 10 and the load 20 that are provided in all the foregoing embodiments of the present disclosure. The load 20 operates under an action of the load voltage. The load is any one of a logic circuit, a functional circuit, a memory, or a processor. It may be understood that, for functions of all modules in the voltage generation apparatus 10, refer to the specific implementations in the apparatus embodiments in FIG. 1 to FIG. 6. Details are not provided herein again.

What is claimed is:

1. A voltage generation apparatus, comprising:
a first voltage division controller and a load connected in series between an input power supply and ground;
a second voltage division controller and the load are connected in parallel between ground and a connection point between the first voltage division controller and the load;
a voltage detector electrically connected to the load and configured to: detect a load voltage of the load, and feed back a detected value of the load voltage; and
a controller electrically connected to the voltage detector, the first voltage division controller, and the second voltage division controller, and configured to:
receive the detected value fed back by the voltage detector, and
generate a control signal based on the detected value, wherein the control signal is used to control the first voltage division controller and the second voltage division controller to adjust the load voltage to a target value, wherein:
when the detected value is greater than the target value, the control signal is used to control a resistance of the first voltage division controller to increase, or control a resistance of the second voltage division controller to decrease, and
when the detected value is less than the target value, the control signal is used to control the resistance of the first voltage division controller to decrease, or control the resistance of the second voltage division controller to increase.

2. The apparatus according to claim 1, wherein the first voltage division controller or the second voltage division controller comprises:
multiple switch-controlled resistor sets connected in parallel, wherein each switch-controlled resistor set comprises at least one parallel switch-controlled resistor, a primary switch-controlled resistor controlled by a control bit in the control signal to control connection or disconnection of the switch-controlled resistor set, and multiple parallel control bits in the control signal are used to control connection or disconnection of the multiple switch-controlled resistor sets.

3. The apparatus according to claim 2, wherein:
when the control bit controls a switch to be on, the switch-controlled resistor set is connected, and the resistance of the first voltage division controller or the resistance of the second voltage division controller is controlled to decrease; or
when the control bit controls the switch to be off, the switch-controlled resistor set is disconnected, and the resistance of the first voltage division controller or the resistance of the second voltage division controller is controlled to increase.

4. The apparatus according to claim 2, wherein the switch-controlled resistor is a power gating cell (PGCell).

5. The apparatus according to claim 4, wherein:
a switch of a PGCell in the first voltage division controller and a switch of a PGCell in the second voltage division controller are different types of transistors; and
a control bit in the control signal received by the switch of the PGCell in the first voltage division controller and a control bit in the control signal received by the switch of the PGCell in the second voltage division controller have a same signal phase.

6. The apparatus according to claim 5, wherein the control bit in the control signal received by the switch of the PGCell in the first voltage division controller and the control bit in the control signal received by the switch of the PGCell in the second voltage division controller are a same control bit.

7. The apparatus according to claim 5, wherein the different types of transistors comprise: a P-channel metal-oxide semiconductor (PMOS) transistor and an N-channel metal-oxide semiconductor (NMOS) transistor.

8. The apparatus according to claim 4, wherein a switch of a PGCell in the first voltage division controller and a switch of a PGCell in the second voltage division controller are a same type of transistor; and
- a control bit in the control signal received by the switch of the PGCell in the first voltage division controller and a control bit in the control signal received by the switch of the PGCell in the second voltage division controller have opposite signal phases.

9. The apparatus according to claim 8, wherein the same type of transistor is a P-channel metal-oxide semiconductor (PMOS) transistor or an N-channel metal-oxide semiconductor (NMOS) transistor.

10. The apparatus according to claim 2, wherein:
- at least one switch-controlled resistor set comprises N parallel switch-controlled resistors, each switch-controlled resistor comprises a resistor and a switch that are connected in series, and N is a positive integer greater than or equal to 2;
- in the N parallel switch-controlled resistors, a control terminal of a switch of a primary switch-controlled resistor is configured to receive a control bit corresponding to the at least one switch-controlled resistor set; and
- in the N parallel switch-controlled resistors, a control terminal of a switch of a current switch-controlled resistor is coupled to a connection point between a switch and a resistor that are connected in series in a previous switch-controlled resistor, and receives a signal output by the connection point.

11. The apparatus according to claim 2, wherein:
- the at least one switch-controlled resistor set comprises N parallel switch-controlled resistor pairs, each switch-controlled resistor pair comprises a pair of parallel switch-controlled resistors, each switch-controlled resistor comprises a resistor and a switch that are connected in series, and N is a positive integer greater than or equal to 2;
- in the N parallel switch-controlled resistor pairs, a control tell final of a switch of a primary switch-controlled resistor in a primary switch-controlled resistor pair is configured to receive a control bit corresponding to the at least one switch-controlled resistor set;
- in the N parallel switch-controlled resistor pairs, a control terminal of a switch of a primary switch-controlled resistor in a current switch-controlled resistor pair is coupled to a connection point between a switch and a resistor that are connected in series in a primary switch-controlled resistor in a previous switch-controlled resistor pair, and receives a signal output by the connection point;
- in the N parallel switch-controlled resistor pairs, a control terminal of a switch of the other switch-controlled resistor in the last switch-controlled resistor pair is coupled to a connection point between a switch and a resistor that are connected in series in a primary switch-controlled resistor in the last switch-controlled resistor pair, and receives a signal output by the connection point; and
- in the N parallel switch-controlled resistor pairs, a control terminal of a switch of the other switch-controlled resistor in the previous switch-controlled resistor pair is coupled to a connection point between a switch and a resistor that are connected in series in the other switch-controlled resistor in the current switch-controlled resistor pair, and receives a signal output by the connection point.

12. The apparatus according to claim 11, wherein in any switch-controlled resistor pair, a resistance of the resistor in the primary switch-controlled resistor is greater than a resistance of the resistor in the other switch-controlled resistor.

13. The apparatus according to claim 2, wherein:
- when the detected value is greater than the target value, at least one control bit of multiple parallel control bits of the control signal is used to control at least one switch-controlled resistor set that is in the first voltage division controller and that corresponds to the at least one control bit, to change from disconnection to connection; or
- when the detected value is less than the target value, at least one control bit of multiple parallel control bits of the control signal is used to control at least one switch-controlled resistor set that is in the first voltage division controller and that corresponds to the at least one control bit, to change from connection to disconnection.

14. The apparatus according to claim 2, wherein:
- when the detected value is greater than the target value, at least one control bit of multiple parallel control bits of the control signal is used to control at least one switch-controlled resistor set that is in the second voltage division controller and that corresponds to the at least one control bit, to change connection to disconnection; or
- when the detected value is less than the target value, at least one control bit of multiple parallel control bits of the control signal is used to control at least one switch-controlled resistor set that is in the second voltage division controller and that corresponds to the at least one control bit, to change from disconnection to connection.

15. The apparatus according to claim 1, wherein the voltage detector comprises:
- a voltage information feedback unit configured to: read an analog load voltage of the load, and convert the voltage to a digital signal;
- a voltage sampling and feedback unit configured to perform sampling on the digital signal based on a clock cycle to obtain a voltage sampling signal; and
- a voltage encoding and feedback unit configured to encode the voltage sampling signal to obtain the detected value of the load voltage.

16. The apparatus according to claim 15, wherein the detected value is a binary serial number.

17. A semiconductor chip, comprising:
- a load;
- a voltage generation apparatus, comprising:
  - a first voltage division controller and the load connected in series between an input power supply and ground,
  - a second voltage division controller and the load connected in parallel between ground and a connection point between the first voltage division controller and the load,
  - a voltage detector electrically connected to the load and configured to: detect a load voltage of the load, and feed back a detected value of the load voltage, and
  - a controller electrically connected to the voltage detector, the first voltage division controller, and the second voltage division controller, and configured to:
    receive the detected value fed back by the voltage detector; and generate a control signal based on the detected value, wherein the control signal is used to control the first voltage division controller and the second voltage division controller to adjust the load voltage to a target value, wherein:
- when the detected value is greater than the target value, the control signal is used to control a resistance of the first voltage division controller to increase, or control a resistance of the second voltage division controller to decrease, and
- when the detected value is less than the target value, the control signal is used to control the resistance of the first voltage division controller to decrease, or control the resistance of the second voltage division controller to increase; and wherein the load operates under an action of the load voltage, and the load is any one of a logic circuit, a functional circuit, a memory, or a processor.

18. The semiconductor chip according to claim 17, wherein the first voltage division controller or the second voltage division controller comprises:
multiple switch-controlled resistor sets connected in parallel, wherein each switch-controlled resistor set comprises at least one parallel switch-controlled resistor, a primary switch-controlled resistor is controlled by a control bit in the control signal to control connection or disconnection of the switch-controlled resistor set, and multiple parallel control bits in the control signal are used to control connection or disconnection of the multiple switch-controlled resistor sets.

19. The semiconductor chip according to claim 18, wherein:
- when the control bit controls a switch to be on, the switch-controlled resistor set is connected, and the resistance of the first voltage division controller or the resistance of the second voltage division controller is controlled to decrease; or
- when the control bit controls the switch to be off, the switch-controlled resistor set is disconnected, and the resistance of the first voltage division controller or the resistance of the second voltage division controller is controlled to increase.

20. The semiconductor chip according to claim 18, wherein the switch-controlled resistor is a power gating cell (PGCell).

* * * * *